(12) United States Patent
Staver

(10) Patent No.: US 10,809,284 B2
(45) Date of Patent: Oct. 20, 2020

(54) SYSTEMS AND METHODS FOR IMPROVED ROOT MEAN SQUARE (RMS) MEASUREMENT

(71) Applicant: Microchip Technology Incorporated, Chandler, AZ (US)

(72) Inventor: Daniel Arthur Staver, Colorado Springs, CO (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 17 days.

(21) Appl. No.: 16/174,520

(22) Filed: Oct. 30, 2018

(65) Prior Publication Data

US 2019/0128928 A1 May 2, 2019

Related U.S. Application Data

(60) Provisional application No. 62/579,437, filed on Oct. 31, 2017.

(51) Int. Cl.
*G01R 19/02* (2006.01)
*G05B 15/02* (2006.01)
*G01R 19/25* (2006.01)

(52) U.S. Cl.
CPC ......... *G01R 19/02* (2013.01); *G01R 19/2506* (2013.01); *G01R 19/2509* (2013.01); *G05B 15/02* (2013.01)

(58) Field of Classification Search
CPC ................ G01R 19/02; G01R 19/2506; G01R 19/2509; G05B 15/02
See application file for complete search history.

(56) References Cited

U.S. PATENT DOCUMENTS

| 6,683,913 B1 * | 1/2004 | Kantschuk | H04B 1/123 333/12 |
| 7,555,067 B2 * | 6/2009 | Jeong | H04B 1/707 375/340 |

(Continued)

FOREIGN PATENT DOCUMENTS

EP 0862060 A2 * 2/1998

OTHER PUBLICATIONS

Wey, Wei-Shinn et al., "A CMOS Delta-Sigma True RMS Converter," IEEE Journal of Solid-State Circuits, vol. 35, No. 2, pp. 248-257, dated Feb. 1, 2000.

(Continued)

*Primary Examiner* — Kidest Bahta
(74) *Attorney, Agent, or Firm* — Slayden Grubert Beard PLLC

(57) ABSTRACT

Systems and methods are provided for improving the operation of a computer or other electronic device that utilizes root-mean-square (RMS) measurements, e.g., RMS current measurements, by reducing error in the RMS measurement. A series of measurement samples are received at a processor, which executes a noise-decorrelated RMS algorithm including: calculating a current-squared value for each measurement sample by multiplying the measurement sample by a prior measurement sample in the series (rather by simply squaring each measurement sample as in conventional techniques), summing the current-squared values, and calculating an RMS value based on the summed values. The processor may also execute a frequency-dependent magnitude correction filter to correct for frequency-dependent attenuation associated with the noise-decorrelated RMS algorithm. The calculated RMS value has a reduced error, particularly for lower-end current measurements, which may (Continued)

improve the operation of the computer or electronic device that utilizes the RMS value.

19 Claims, 3 Drawing Sheets

(56) References Cited

U.S. PATENT DOCUMENTS

| | | | | |
|---|---|---|---|---|
| 2004/0249876 | A1* | 12/2004 | Tuladhar | G01R 19/02 |
| | | | | 708/490 |
| 2007/0081224 | A1* | 4/2007 | Robinson | H04N 17/002 |
| | | | | 359/245 |
| 2008/0007247 | A1* | 1/2008 | Gervais | G01R 21/133 |
| | | | | 324/76.38 |
| 2011/0220145 | A1* | 9/2011 | Arrington | B08B 9/0826 |
| | | | | 134/6 |
| 2012/0095704 | A1 | 4/2012 | Gervais et al. | 702/45 |
| 2014/0233144 | A1* | 8/2014 | Seon | G01R 19/02 |
| | | | | 361/115 |
| 2014/0233288 | A1* | 8/2014 | Kouwenhoven | G01R 19/02 |
| | | | | 363/124 |
| 2015/0316587 | A1* | 11/2015 | Dionne | G01R 19/02 |
| | | | | 324/76.38 |
| 2018/0088154 | A1* | 3/2018 | Zimmermann | G01R 19/02 |

OTHER PUBLICATIONS

International Search Report and Written Opinion, Application No. PCT/US2018/058324, 13 pages, dated Jan. 21, 2019.

* cited by examiner

SYSTEMS AND METHODS FOR IMPROVED ROOT MEAN SQUARE (RMS) MEASUREMENT

RELATED PATENT APPLICATION

This application claims priority to commonly owned U.S. Provisional Patent Application No. 62/579,437 filed Oct. 31, 2017, the entire contents of which are hereby incorporated by reference for all purposes.

TECHNICAL FIELD

The present disclosure relates to current measurement, and more particularly, to systems and methods for improved RMS (root mean square) measurement, e.g., RMS current ($I_{RMS}$) measurement.

BACKGROUND

Conventional systems for measuring fundamental current component typically employ a metrology algorithm that compute RMS current by auto-correlating sampled current data (i.e., each datum is multiplied by itself) and then accumulating the auto-correlated data. The auto-correlation increases the effect of noise in the sample, which may prevent the ability to reduce or remove the noise by averaging. Such techniques may provide high error results at the lower end of current measurement, due to the auto-correlated noise, e.g., incorporated in the $I\_x^2$ term in the following equation for RMS current:

$$I_{RMS\_x} = \sqrt{\frac{\sum_{n=1}^{N} I\_x_n^2}{N}} = K\_Ix \times \sqrt{\frac{ACC\_I\_x}{N}} \quad (1)$$

where $I_{RMS\_x}$ is the RMS current for a current sample stream, $I\_x_n$ represents each current measurement datum, N is the number of current measurement samples, $K\_Ix$ represents a conversion scaling factor from internal numeric units to outside world units (Amps), and $ACC\_I\_x$ represents the internal metrology accumulator for $I^2$-samples.

FIG. 1 illustrates example RMS current measurement error as a function of current, for the following example parameters, using a conventional RMS metrology technique (e.g., based on Equation 1):
  Measurement using $I^2h$ [current-squared-hours] accumulator scaled to 240 A maximum range;
  Kt=0.075
  t≥36 sec
  24000:1 range As shown, the measurement error increases greatly at the lower end of current measurement, as the percentage of the signal that is represented by noise increases with decreasing current.

BRIEF DESCRIPTION OF THE DRAWINGS

Example aspects of the present disclosure are described below in conjunction with the figures, in which.

SUMMARY

Embodiments of the present invention provide systems and methods are provided for improving the operation of a computer or other electronic device that utilizes root-mean-square (RMS) measurements, by reducing error in the RMS measurement. The disclosed concepts may apply to any type of RMS measurements, such as current and voltage RMS measurements, for example. In the case of RMS current measurement, a series of current measurement samples are received at a processor, which executes a noise-decorrelated RMS current algorithm including: calculating a current-squared value for each current measurement sample by multiplying the current measurement sample by a prior current measurement sample in the series (rather by simply squaring each current measurement sample as in conventional techniques), summing the current-squared values, and calculating an RMS current based on the summed values. The processor may also execute a frequency-dependent magnitude correction filter to correct for frequency-dependent attenuation associated with the noise-decorrelated RMS algorithm. The calculated RMS current has a reduced error, particularly for lower-end current measurements, which may improve the operation of the computer or electronic device that utilizes the RMS current.

DETAILED DESCRIPTION

Embodiments of the present disclosure provide systems and methods for improved measurement of RMS (root mean square) current, e.g., by combining a present current sample stream with a delayed version of the current sample stream. In some embodiments, each sampled current datum is multiplied by the current datum delayed by one sample to generate resulting $I^2$ samples for calculating a current RMS. Noise is thereby decorrelated between the two $I^2$ sample product terms, resulting in noise reduction through statistical averaging.

Thus, the inventive technique decorrelates noise of fundamental harmonic current component measurement, $I_{RMS\_Fundamental}$. This decorrelation may introduce a frequency-dependent attenuation; thus, some embodiments may include a frequency-dependent magnitude correction DSP filter to correct or compensate for such frequency-dependent attenuation. In some embodiments, this filter may be implemented to achieve pole and zero placement using a single multiplication and two additions, which may guarantee a desired pole/zero placement to minimize or reduce noise due to finite math effects. For example, in some embodiments, frequency attenuation is corrected over a passband of interest [45, 66] Hz using a simple DSP filter implemented to ensure pole-zero stability.

Some embodiment may greatly reduce RMS measurement error for low-end current measurement, as compared with conventional techniques, e.g., as discussed below in more detail (e.g., with reference to FIG. 4 discussed below).

Figure 1:
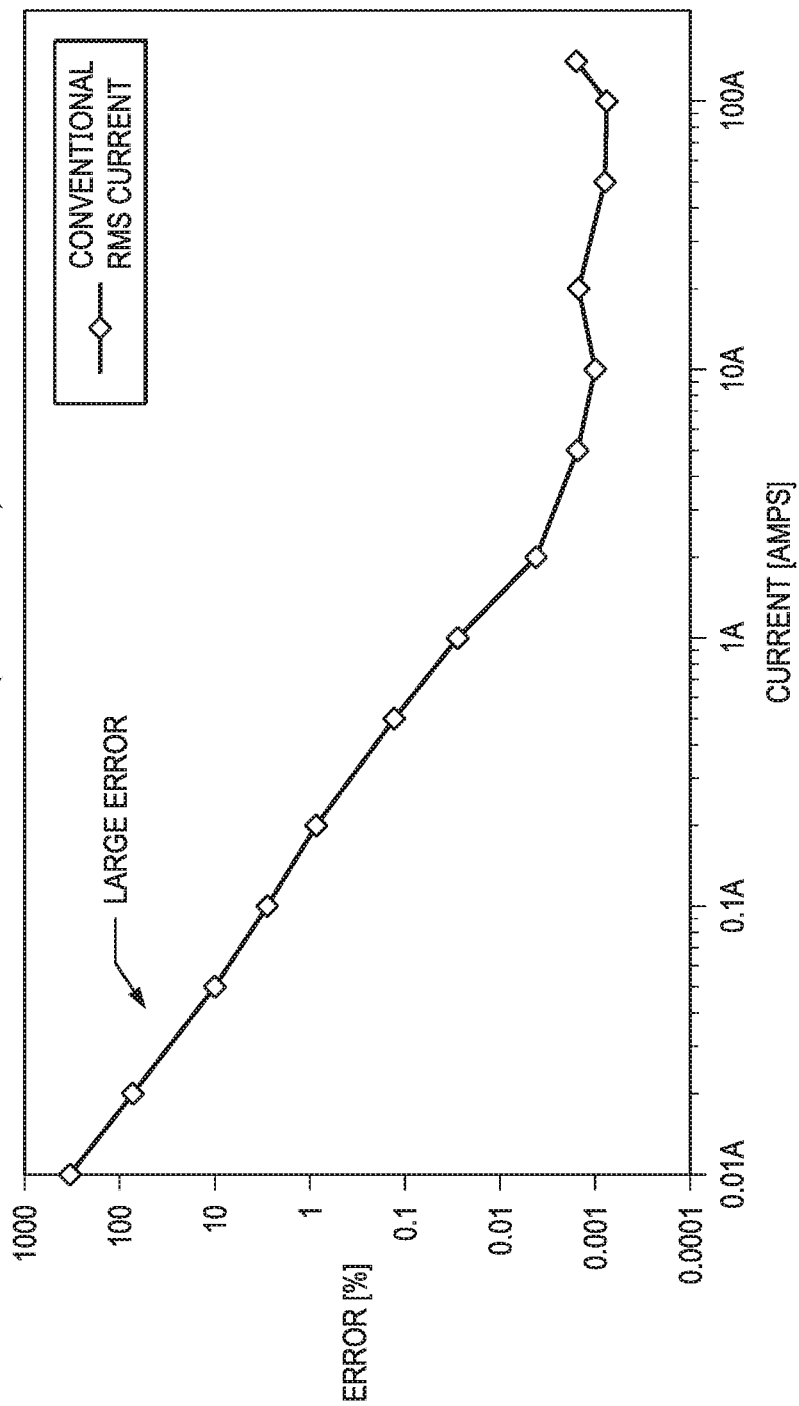
FIG. 1 illustrates example RMS current measurement error as a function of current, showing large measurement errors for lower current levels, using a conventional RMS measurement technique.
Figure 2:
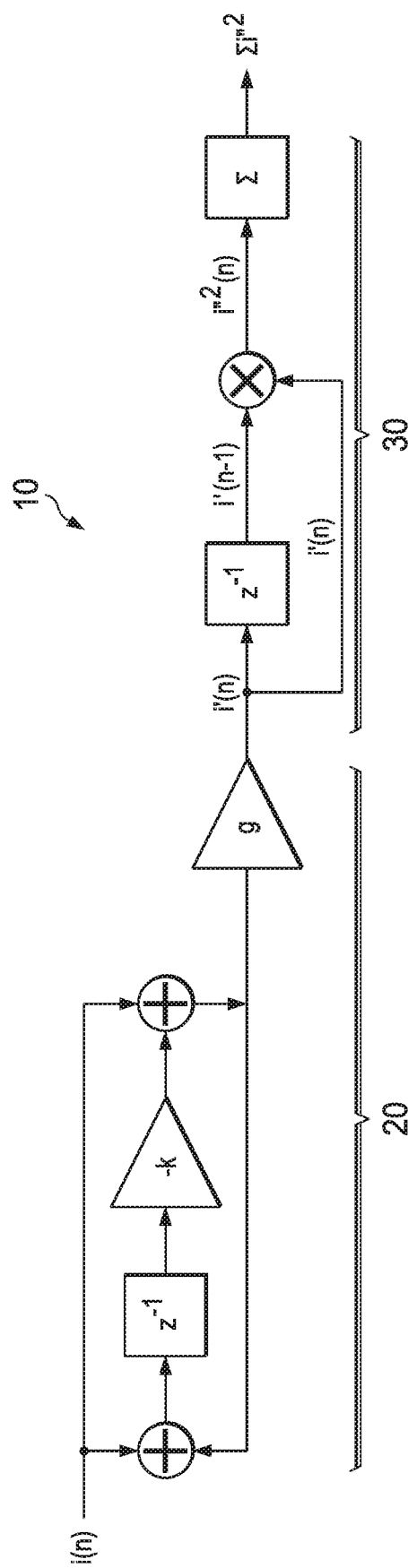
FIG. 2 shows an example algorithm for improved fundamental current RMS measurement, for improving the operation of a computer or other electronic device(s), according to an example embodiment of the present invention.

FIG. 2 shows an example algorithm 10 for improved fundamental current RMS measurement for improving the operation of a computer or other electronic device(s), according to an example embodiment of the present invention. Algorithm 10 may be implemented by any suitable hardware, software, firmware, or combination thereof. Some embodiments include a microprocessor, memory, microcontroller, and/or other suitable devices for performing the data processing and/or data storage of the disclosed techniques.

Example algorithm 10 includes a digital (DSP) frequency-dependent gain correction filter 20 and a noise-decorrelated RMS routine 30. Noise-decorrelated RMS routine 30 is designed to calculate an improved RMS current (e.g., with reduced error especially for low-current measurements), by decorrelating the noise in the current sample data that is auto-correlated (and thus magnified) in the conventional RMS algorithm. As this decorrelation may introduce a frequency-dependent attenuation (based on the relevant line frequency), the frequency-dependent gain correction filter 20 is designed to correct for such frequency-dependent attenuation.

In some embodiments, the frequency-dependent attenuation introduced by the disclosed decorrelation approach is a non-linear function of the ratio of line frequency and the sampling frequency. Over the narrow-bandwidth of interest that the fundamental line frequency is expected to drift, for example, 45-66 Hz, filter 20 may be configured correct the attenuation introduced by the decorrelation approach.

Referring to algorithm 10, a series of input current samples i(n) (sampled data proportional to current being measured) are received at the frequency-dependent gain correction filter 20 from a source of current samples, e.g., a narrow-band filtered stream of current samples filtered to substantially remove harmonic content outside of the bandwidth of interest, for example frequencies outside of 45-66 Hz. Input current samples i(n) may be received at DSP filter 20 at a sampling frequency, e.g., 4000 Hz. In the illustrated embodiment, frequency-dependent gain correction filter 20 comprises an infinite impulse response (IIR) filter and gain amplifier "g" configured to generate a first intermediate output, i'(n), which pre-corrects for frequency attenuation associated with the multiplication step performed in the noise-decorrelated RMS routine 30 (discussed below).

As shown in FIG. 2, the first intermediate output i'(n) generated by gain correction filter 20 is passed to noise-decorrelated RMS routine 30, which multiplies each datum i'(n) output by gain correction filter 20 with the datum delayed by one sample, i'(n−1), to provide noise-decorrelated current-squared samples defining a second intermediate output i"(n). The second intermediate output i"(n) is accumulated for "N" samples over an integral number of half cycles of the line frequency to produce the final output, $\Sigma i"^2$. This final output value may then be used in the conventional manner to calculate the $I_{RMS\_Fundamental}$ value (fundamental harmonic RMS current) using the equation: $I_{RMS}=\text{sqrt}(\Sigma i"^2/N)$.

The values for the constant "k" and gain factor "g" in the frequency-dependent gain correction filter 20 may have any suitable static or dynamic values, and determined in any suitable manner for optimized or desired results, e.g., based on the line frequency and/or current sampling frequency. In one example embodiment for a line frequency band of [45, 66] Hz and a 4 KHz sampling frequency, optimal constant values are determined and set as k=0.217143 and g=1.5547492444. Other frequency-dependent filters may be implemented in other embodiment, e.g., based on the particular application of the algorithm.

Figure 3:
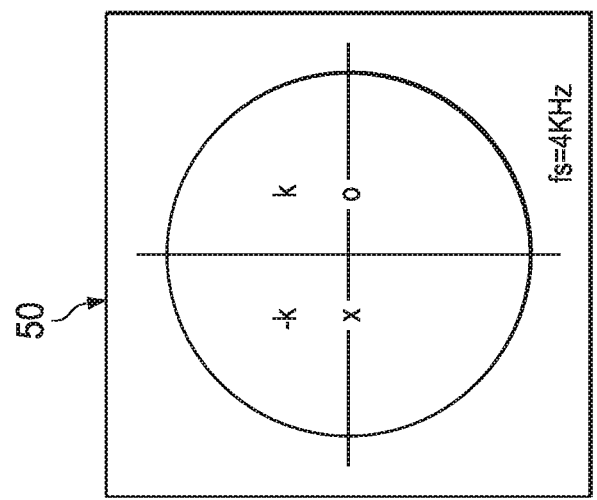
FIG. 3 is a pole-zero plot showing digital signal processing filter used to provide frequency-dependent gain compensation filter of the example algorithm shown in FIG. 2, according to an example embodiment of the invention.

FIG. 3 is an example pole-zero plot 50 showing stability provided by the example frequency-dependent gain correction filter 20 shown in FIG. 2, and using the example values discussed above, according to an example embodiment.

Thus, based on the above, embodiments of the invention may allow a direct computation of $I_{RMS\_Fundamental}$, based on the conventional concept of using the $I^2$-samples accumulator, and also maintain significant accuracy at very low end of current range (e.g., 24000:1).

One embodiment has been tested for an example measurement at 10 mA (using a maximum 240 A meter). A conventional $I_{RMS}$ calculation provided 25.386 mA, which represents a 153.857% error. An $I_{RMS}$ calculation using example algorithm 10 shown in FIG. 2 provided 9.879 mA, which represents an error of only −1.214%. In addition, testing shows that the response across entire of fundamental line frequency passband [45, 66] Hz is flat to less than 0.001%.

Some embodiment may greatly reduce current RMS measurement error, as compared with conventional techniques. For example, system and methods according to the present invention can reduce RMS measurement error percentage by a factor of at least 2, at least 5, at least 10, or at least 100. Some embodiments may reduce RMS measurement error from an error of greater than 200% (provided by a conventional technique for measuring RMS current) to less than 2% for low-current RMS measurements.

Figure 4:
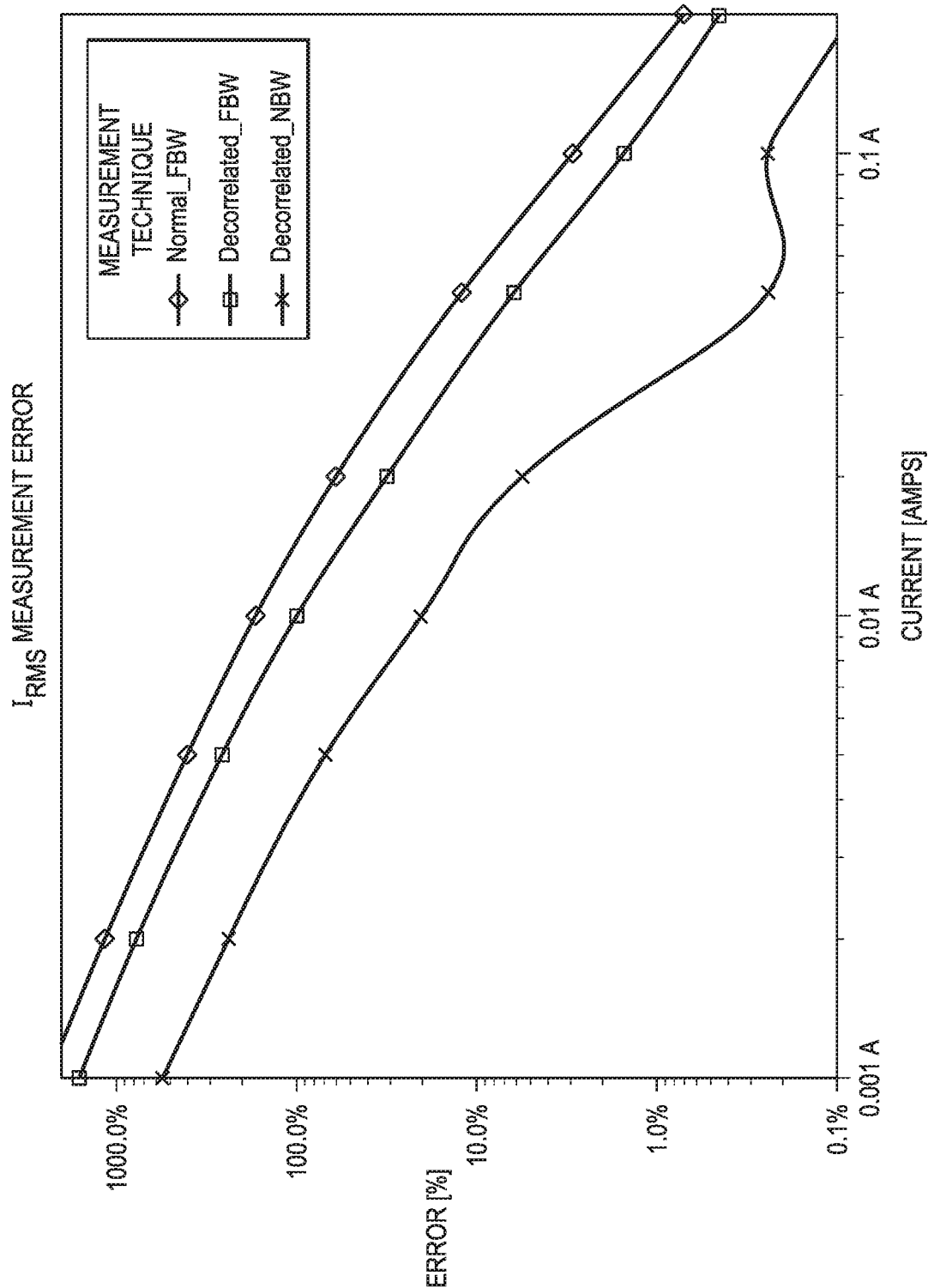
FIG. 4 illustrates example test data for example embodiments of the present invention, showing a significant reduction in RMS current measurement errors as compared with a conventional RMS measurement technique.

FIG. 4 illustrates example test data for one example embodiment of the present invention, showing a significant reduction in RMS current measurement errors as compared with a conventional RMS measurement technique. FIG. 4 shows error rates provided by (a) a conventional full-bandwidth approach ("Normal_FBW"), a FBW (Full Band Width) de-correlated noise approach ("Decorrelated_FBW"), and a NBW (Narrow Band Width) de-correlated noise approach ("Decorrelated_NBW"). As shown, both the FBW and NBW de-correlated noise approaches provide a noticeable noise reduction from the conventional FBW approach. In particular, the example FBW de-correlated noise approach reduced noise by about half, while the example NBW de-correlated noise approach reduced noise by about or more than a factor of 10 for the tested current levels. Thus, this example embodiment provides a noticeable error reduction for the FBW approach, and even a greater error reduction for NBW measurements.

Embodiments of the invention can be incorporated or used in any suitable computers or electronic devices or products, e.g., incorporated in the metrology firmware on a microcontroller or a dual-core ARM Cortex M4 processor, for example.

Figure 5:
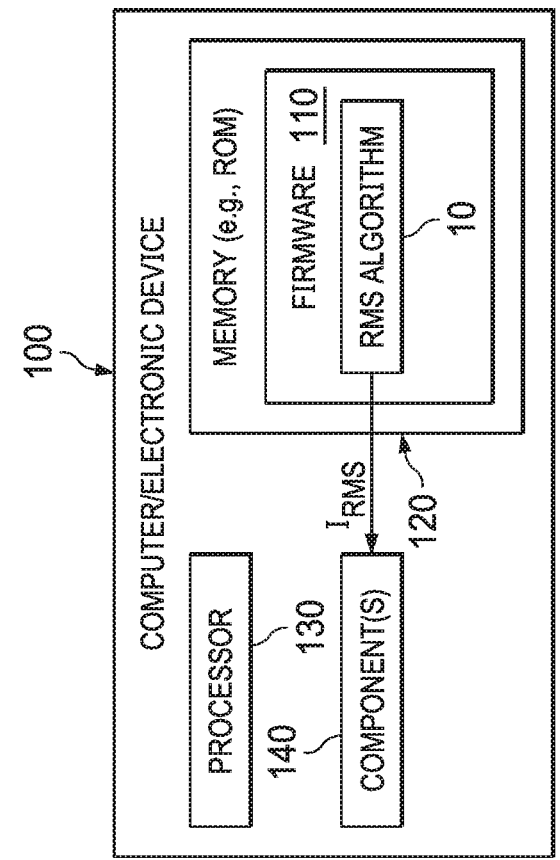
FIG. 5 illustrates an example electronic device, e.g., a microcontroller or microprocessor, that implements the example algorithm shown in FIG. 2, e.g., embodied as firmware, for providing improved RMS current measurement for improving the operation of the example electronic device and/or an associated computer or other electronic devices, according to one embodiment of the present invention.

FIG. 5 illustrates an example electronic device 100, e.g., a computer or other electronic device, that implements the example algorithm 10 shown in FIG. 2 for providing improved RMS measurement, e.g., RMS current measurement, for improving the operation of the example electronic device 100, one or more components of the electronic device 100, and/or an associated computer or other electronic devices, according to one embodiment of the present invention.

As shown, electronic device 100 may include a memory device 120, a processor 130 (e.g., a microprocessor), and one or more electronic components or circuitry 140. The example RMS algorithm 10 shown in FIG. 2 or other similar RMS algorithm may be embodied in firmware 110 in memory device 120 (e.g., flash ROM) and executable by processor 130 for providing improved RMS measurement, e.g., improved RMS current measurement for a current within or associated with electronic device 100. In other embodiments, RMS algorithm 10 may be embodied in software stored in a suitable memory device 120 and executable by processor 130. The improved RMS measurement, e.g., RMS current measurement, may be used by electronic component(s) or circuitry 140 to thereby provide reduced-error measurement values (e.g., reduced-error RMS current values) to thereby improve the operation of component(s)/circuitry 140. In some embodiments, processor 120 and memory 120 storing RMS algorithm 10 (and in some embodiments, component(s)/circuitry 140 that utilizes the improved RMS measurements) may be embodied in a microcontroller.

Embodiments of the systems and methods (algorithms) disclosed herein may provide one or more technical advantages. Traditional RMS calculations square each datum and sum the squared terms. This doubles the noise due to auto-correlation of the noise. Embodiments of the present invention de-correlate the noise to significantly improve the RMS measurement, especially at the low end of the measurement range where the noise is commensurate with signal or larger than the signal. Thus, the disclosed systems and methods may allow dramatically improved accuracy for RMS current measurement, especially at the low-end of the current range, and thus provide extended range current measurement. In addition, the disclosed systems and methods may be simple to implement with little additional added DSP overhead. The systems and methods may allows traditional calculation method of $I_{RMS\_Fundamental}$ component, and may allow accurate pulse measurement of $I^2$-hr_Fundamental quantities at low rates using standard meter test equipment.

The invention claimed is:

1. A method for improving the operation of a computer or other electronic device that utilizes root-mean-square (RMS) measurements, by reducing error in the RMS measurement, the method comprising:
receiving, at a processor of the computer or other electronic device, a series of measurement samples;
executing, by the processor, a noise-decorrelated RMS algorithm including:
for each received measurement sample, calculating an adjusted sample value by a mathematical combination step comprising multiplying each respective measurement sample by a prior measurement sample in the sequence; and
summing the adjusted sample values for the sequence of measurement samples; and
calculating an RMS value based on the summed adjusted sample values;
executing, by the processor, a frequency-dependent magnitude correction filter to the series of measurement samples to correct for a frequency-dependent attenuation associated with the noise-decorrelated RMS algorithm; and
controlling at least one component of the computer or other electronic device based on the calculated RMS value.

2. The method of claim 1, wherein the series of measurement samples comprise a series of current measurement samples, and the RMS value calculated by execution of the noise-decorrelated RMS algorithm is an RMS current value.

3. The method of claim 1, wherein multiplying each respective measurement sample by a prior measurement sample in the sequence comprises multiplying each received measurement sample by the immediately previous measurement sample in the sequence to calculate a current-squared value.

4. The method of claim 1, wherein the frequency-dependent magnitude correction filter comprises an infinite impulse response (IIR) filter.

5. The method of claim 1, comprising executing the frequency-dependent magnitude correction filter for each measurement sample prior to executing the noise-decorrelated RMS algorithm for each respective received measurement sample.

6. The method of claim 1, wherein the frequency-dependent magnitude correction filter is configured to achieve a stable pole and zero placement using a single multiplication and two additions.

7. The method of claim 1, wherein the computer or other electronic device that utilizes root-mean-square (RMS) measurements comprises a microcontroller.

8. The method of claim 1, wherein the computer or other electronic device that utilizes root-mean-square (RMS) measurements comprises a microprocessor.

9. The method of claim 1, wherein the computer or other electronic device that utilizes root-mean-square (RMS) measurements comprises a computer including at least one microcontroller or microprocessor.

10. A system for improving the operation of a computer or other electronic device that utilizes root-mean-square (RMS) measurements, by reducing error in the RMS current, the system comprising:
a memory device storing a noise-decorrelated RMS algorithm; and
a processor configured to:
receive a series of measurement samples; and
execute the noise-decorrelated RMS algorithm including:
for each received measurement sample, calculating an adjusted sample value by a mathematical combination step comprising multiplying each respective measurement sample by a prior measurement sample in the sequence; and
summing the adjusted sample values for the sequence of measurement samples; and
calculating the RMS value based on the summed adjusted sample values; and
execute a frequency-dependent magnitude correction filter to the series of measurement samples to correct for a frequency-dependent attenuation associated with the noise-decorrelated RMS algorithm.

11. The system of claim 10, wherein the series of measurement samples comprise a series of current measurement samples, and the RMS value calculated by execution of the noise-decorrelated RMS algorithm is an RMS current value.

12. The system of claim 10, wherein the processor is integrated in a microcontroller.

13. The system of claim 10, wherein the processor comprises a microprocessor.

14. The system of claim 10, wherein multiplying each respective measurement sample by a prior measurement sample in the sequence multiplying each received measurement sample by the immediately previous measurement sample in the sequence to calculate a current-squared value.

15. The system of claim 10, wherein the frequency-dependent magnitude correction filter comprises an infinite impulse response (IIR) filter.

16. The system of claim 10, wherein the processor is configured to execute the frequency-dependent magnitude correction filter for each measurement sample prior to executing the noise-decorrelated RMS algorithm for each respective received measurement sample.

17. The system of claim 10, wherein the frequency-dependent magnitude correction filter is configured to achieve a stable pole and zero placement using a single multiplication and two additions.

18. A method for improving the operation of a computer or other electronic device that utilizes root-mean-square (RMS) measurements, by reducing error in the RMS measurement, the method comprising:

receiving, at a processor of the computer or other electronic device, a series of measurement samples;

executing, by the processor, a noise-decorrelated RMS algorithm to calculate RMS values from the series of measurement samples, the noise-decorrelated RMS algorithm including:

a noise-decorrelated RMS routine that decorrelates noise in the measurement samples; and a frequency-dependent gain correction filter that corrects for frequency-dependent attenuation introduced by the noise-decorrelated RMS routine;

wherein the frequency-dependent gain correction filter precedes the noise-decorrelated RMS routine in the noise-decorrelated RMS algorithm;

controlling at least one component of the computer or other electronic device based on the calculated RMS values.

19. The method of claim 18, wherein the noise-decorrelated RMS routine includes multiplying each measurement sample in the series of measurement samples by a prior measurement sample in the series of measurement samples.

* * * * *